(12) United States Patent
Yeh et al.

(10) Patent No.: US 10,074,533 B1
(45) Date of Patent: Sep. 11, 2018

(54) STRUCTURE OF EPITAXIAL WAFER AND METHOD OF FABRICATING THE SAME

(71) Applicant: Industrial Technology Research Institute, Hsin-Chu (TW)

(72) Inventors: Po-Chun Yeh, Taichung (TW); Kan-Hsueh Tsai, Changhua County (TW); Chuan-Wei Tsou, Hsinshu (TW); Heng-Yuan Lee, Hsinchu County (TW); Hsueh-Hsing Liu, Taipei (TW); Han-Chieh Ho, Hsinchu County (TW); Yi-Keng Fu, Hsinchu County (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 15/723,390

(22) Filed: Oct. 3, 2017

(30) Foreign Application Priority Data

Aug. 4, 2017 (TW) .............................. 106126446 A

(51) Int. Cl.
| | | |
|---|---|---|
| *H01L 21/02* | (2006.01) | |
| *H01L 29/06* | (2006.01) | |
| *H01L 29/267* | (2006.01) | |
| *H01L 29/16* | (2006.01) | |
| *H01L 29/20* | (2006.01) | |

(52) U.S. Cl.
CPC .... *H01L 21/02035* (2013.01); *H01L 21/0243* (2013.01); *H01L 21/0254* (2013.01); *H01L 21/02381* (2013.01); *H01L 29/0657* (2013.01); *H01L 29/267* (2013.01); *H01L 21/02458* (2013.01); *H01L 21/02502* (2013.01); *H01L 29/16* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 6,391,748 | B1 | 5/2002 | Temkin et al. |
| 6,417,108 | B1 | 7/2002 | Akino et al. |
| 6,420,197 | B1 | 7/2002 | Ishida et al. |
| 7,001,791 | B2 | 2/2006 | Kryliouk et al. |
| 7,245,002 | B2 | 7/2007 | Akino et al. |
| 7,256,148 | B2 | 8/2007 | Kastenmeier et al. |
| 8,183,669 | B2 | 5/2012 | Ishibashi et al. |
| 2004/0041143 | A1 | 3/2004 | Kim et al. |

(Continued)

FOREIGN PATENT DOCUMENTS

CN 103137656 6/2013

OTHER PUBLICATIONS

Itoh et al. "Study of cracking mechanism inGaN/a_Al2O3 structure", Journal of Applied Physics 58, 1828 (May 1985), Published by the American Institute of Physics.

(Continued)

*Primary Examiner* — Calvin Choi
(74) *Attorney, Agent, or Firm* — WPAT, PC

(57) ABSTRACT

This disclosure provides an epitaxial wafer, which includes: a silicon wafer having a central area and an extremity area enclosing the central area, the extremity area having a stepped profile; and an nitride epitaxial layer formed on the silicon wafer; wherein, the stepped profile has a width between 10 and 1500 μm and a height between 1 and 500 μm.

7 Claims, 6 Drawing Sheets

(56) References Cited

U.S. PATENT DOCUMENTS

2008/0188078 A1* 8/2008 Iguchi .................. H01L 31/184
                                                            438/689
2009/0291621 A1* 11/2009 Yamada ............ H01L 21/02021
                                                            451/44

OTHER PUBLICATIONS

Arulkumaran et al. "Direct current and microwave characteristics of sub-micron AlGaN/GaN high-electron-mobility transistors on 8-Inch Si(111) substrate", Japanese Journal of Applied Physics 51 (Oct. 11, 2012), Japanese Journal of Applied Physics.
Krost et al. "GaN-based epitaxy on silicon: stress measurements", Published Oct. 20, 2003, Wiley-VCH Verlag GmbH & Co. KGaA, Weinheim.
Zhu et al. "Prospects of III-nitride optoelectronics grown on Si", Published Oct. 3, 2013, Reports on Progress in Physics, IOP Publishing Ltd, UK & the USA.
Danilewsky et al. "Crack propagation and fracture in silicon wafers under thermal stress", Feb. 6, 2013, Journal of Applied Crystallography.
Taiwan Intellectual Property Office, TIPO, Office Action dated Mar. 5, 2018.

* cited by examiner

STRUCTURE OF EPITAXIAL WAFER AND METHOD OF FABRICATING THE SAME

CROSS-REFERENCE TO RELATED APPLICATION

This application claims the benefit of Taiwan application Serial No. 106126446, filed on Aug. 4, 2017, the disclosure of which is incorporated by reference herein in its entirety.

TECHNICAL FIELD

The present invention relates to an epitaxial wafer and, more particularly, to a silicon wafer whose extremity is trimmed to have a stepped profile before the growth of the epitaxial layer.

BACKGROUND

Gallium nitride (GaN) is a prospect candidate for next-generation high-speed and high-power switching devices, due to its wide bandgap, high electron mobility and large breakdown voltage. Such kind of nitride can be grown on a silicon (Si) wafer by epitaxial growth, to be a so-called nitride-on-Si epitaxial wafer or epi-wafer.

The growth of GaN on a Si wafer is very difficult due to the large mismatch in lattice constants and thermal expansion coefficients, causing many drawbacks like warpage, slip lines, and cracks on the epitaxial wafer. Therefore, it is in need of a new and advanced solution of epitaxial wafer.

SUMMARY

According to one aspect of the present disclosure, one embodiment provides an epitaxial wafer including: a silicon wafer having a central area and an extremity area enclosing the central area, the extremity area having a stepped profile; and an nitride epitaxial layer formed on the silicon wafer; wherein, the stepped profile has a width between 10 and 1500 μm and a height between 1 and 500 μm.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1A:
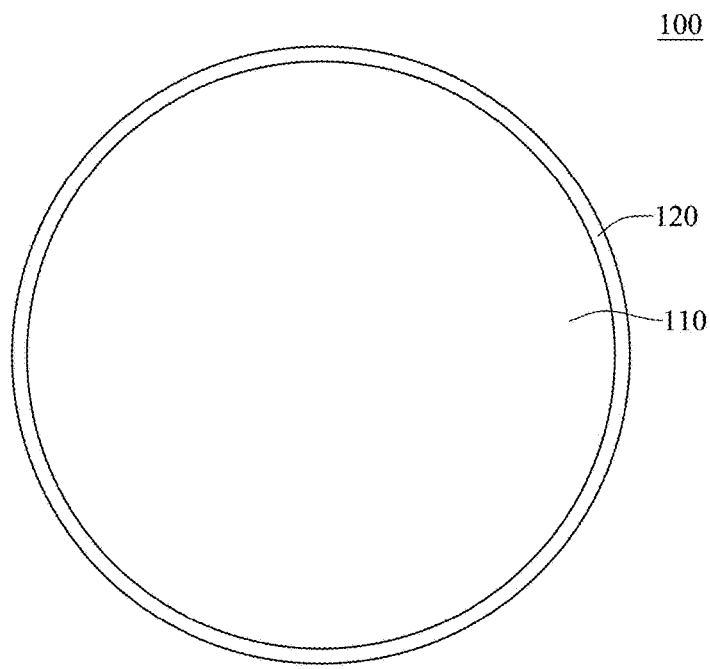
FIG. 1A is a plan view of a Si wafer according to one embodiment of the present invention.
Figure 1B:
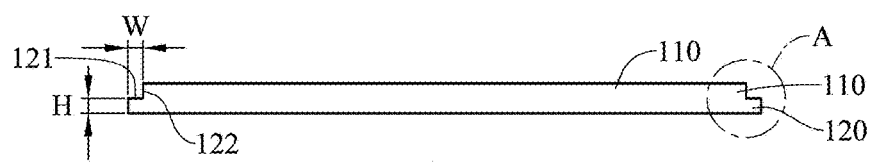
FIG. 1B is a cross-sectional view of a Si wafer according to one embodiment of the present invention.

FIGS. 1A and 1B respectively illustrate a plan view and a cross-sectional view of a Si wafer 100 according to one embodiment of the present invention. The Si wafer 100 includes a central area 110 and an extremity area 120, and the extremity area 120 encloses or peripherally surrounds the central area 110 like a ring, as shown in FIG. 1A. The Si wafer 100 may have a diameter of 6, 8, or 12 inches; here, the current disclosure is applicable to the embodiments in which a Si wafer has a diameter of at least 6 inches. The extremity area 120 can be regarded as a ring edging with a width between 10 and 1500 μm enclosing the central area 110. Taking a 8-inch Si wafer as an example, if the width W of the extremity area 120 is 100 μm, the area ratio of the extremity area 120 to the Si wafer 100 is very small, about 0.2%, and the extremity area 120 occupies the outermost edging of the Si wafer 100; hence, the arrangement of the extremity area 120 would have a minor influence on the number of gross die per wafer (DPW).

Figure 2A:
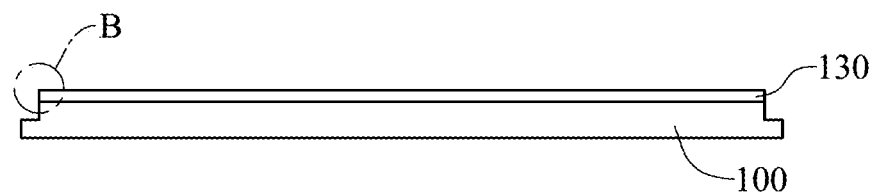
FIG. 2A is a cross-sectional view of an epitaxial wafer according to one embodiment of the present invention.
Figure 2B:
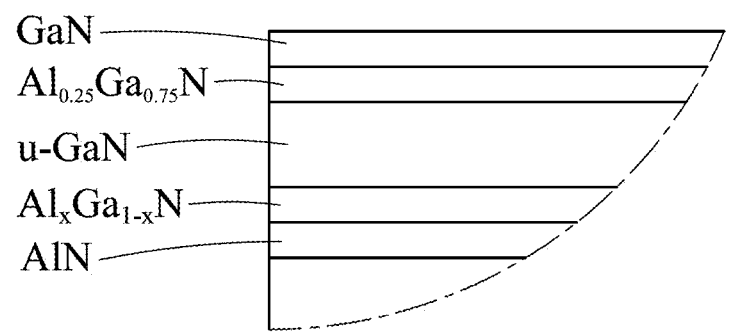
FIG. 2B is an enlarged diagram of the circle B in FIG. 2A.

In the following embodiment, the Si wafer 100 is used as a substrate wafer on which an epitaxial layer is to be grown, to form a so-called epitaxial wafer. Generally, the epitaxial layer is not made of the same material as the substrate wafer; for example, a nitride-on-Si epitaxial wafer is a Si wafer with a nitride epitaxial layer grown thereon. Here, a nitride epitaxial layer 130 may be then formed on the upper surface of the Si wafer 100 as shown in FIG. 2A. The nitride epitaxial layer 130 may have a multi-layered structure like GaN/Al$_{0.25}$Ga$_{0.75}$N/u-GaN/Al$_x$Ga$_{1-x}$N/AlN as shown in FIG. 2B, which is an enlarged diagram of the circle B in FIG. 2A; wherein, GaN is gallium nitride, $Al_xGa_{1-x}N$ is a alloy of aluminum nitride and gallium nitride with a ratio of x, u-GaN is undoped gallium nitride, and MN is aluminum nitride. In other embodiments, the epitaxial layer 130 may be arranged to be another multi-layered structure according to the electronic or opto-electronic devices to be fabricated.

Figure 3:
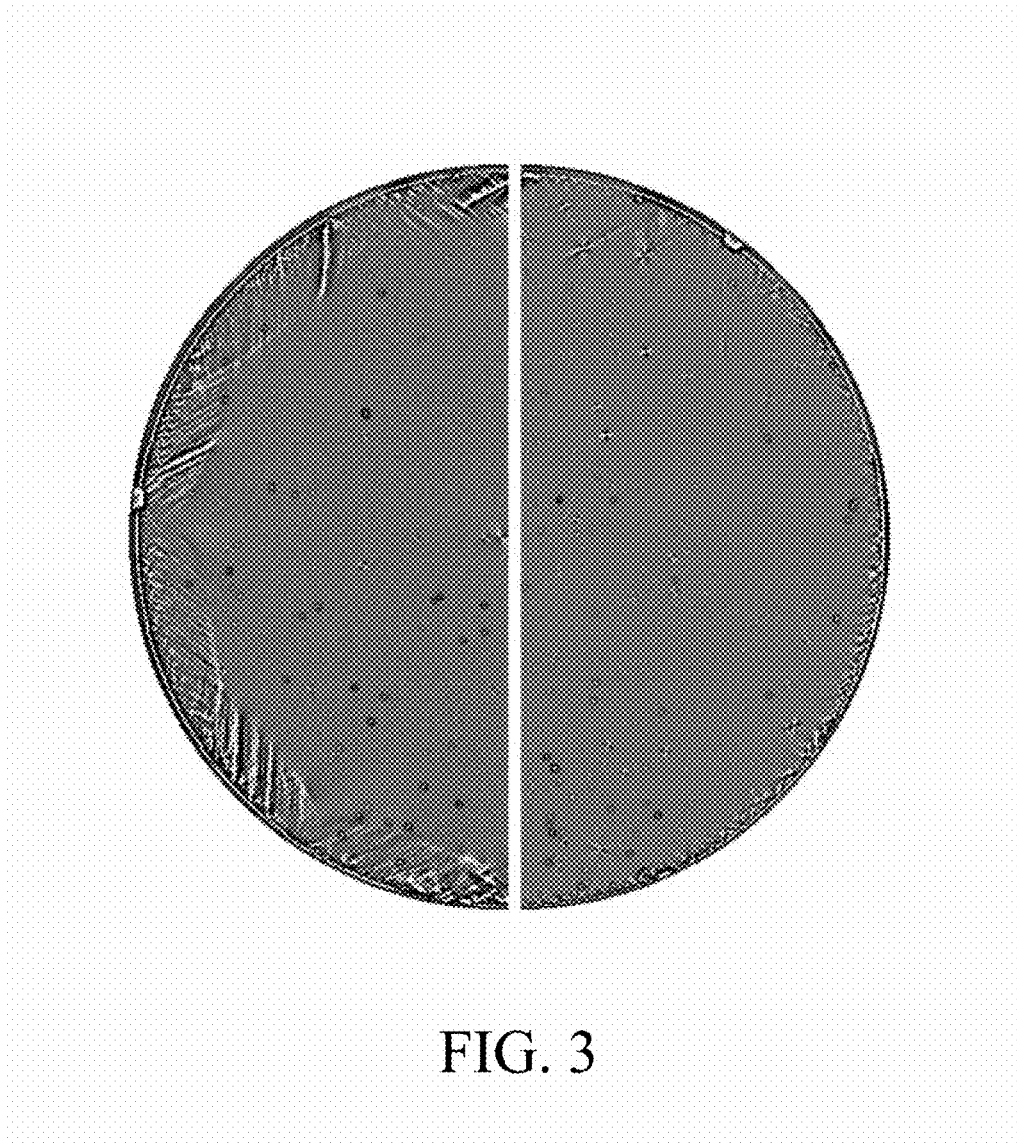
FIG. 3 shows polarized infrared images taken on epitaxial wafers of the prior art (left) and the current embodiment (right).

The growth of an epitaxial layer on a wafer substrate is very difficult due to the large mismatch in their lattice constants and thermal expansion coefficients, causing many drawbacks like warpage, slip lines, and cracks on the epitaxial wafer. To solve such problems, a strain buffer/compensation layer of $Al_xGa_{1-x}N$/AlN is formed on a standard 8-inch Si wafer, and a multi-layered structure of $GaN/Al_{0.25}Ga_{0.75}N$/u-GaN is then formed on the strain buffer/compensation layer in a prior art, as shown in FIG. 2B. The left image in FIG. 3 shows a polarized infrared image taken of the prior-art epitaxial wafer, which reveals surface defects like localized dislocations, slip lines, twin lines, and epitaxial growth caused edge defects, especially in the non-central area.

In one embodiment, the extremity area 120 is trimmed to have a stepped profile as shown in the enlarged diagram of circle A in FIG. 1B. The stepped profile has one step with a tread 121 and a riser 122. The tread 121 has the same width W as the extremity area 120, of about 10-1500 µm as recited above. The riser 122 has a height H of about 1-500 µm, equal to the thickness difference between the central area 110 and the extremity area 120. The right image in FIG. 3 shows a polarized infrared image taken of an epitaxial wafer according to the embodiment, in which the same nitride epitaxial layer is formed on a standard 8-inch Si wafer with its tread width W=500 µm and riser height H=200 µm. Compared with the prior art without a stepped profile in the extremity area, the surface defects are remarkably diminished. The result supports that the stepped profile in the extremity area on the Si wafer is capable of restraining the generation of the slip lines and cracks near the wafer edge during the process of nitride epitaxial growth; thus, the fabrication difficulty of a nitride-on-Si epitaxial device can be reduced with the device characteristic improved.

In other embodiments, an epitaxial wafer may be formed by using a substrate wafer of different material from the epitaxial layer thereon and trimming the substrate wafer to have a step-profiled peripheral extremity. The surface defects due to lattice and thermal expansion mismatch between the epitaxial layer and the substrate wafer can thus be diminished, especially for large-size substrate wafers like a 6-inch silicon carbide (SiC) wafer and a 6, 8 or 12-inch Si wafer.

Figure 1C:
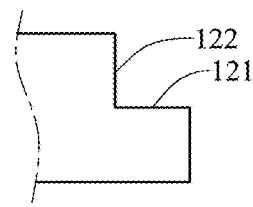
FIG. 1C is an enlarged diagram of the circle A in FIG. 1B.
Figure 4A:
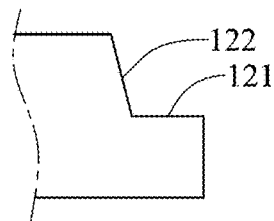
FIGS. 4A and 4B are cross-sectional views of the step-profiled peripheral extremity according to the embodiment.
Figure 4B:
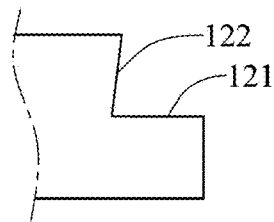

The riser 122 is vertical to the tread 121 as shown in FIG. 1C, but the riser 122 may be oblique to the tread 121 in other embodiments. For example, an obtuse angle may be formed between the riser 122 and the tread 121 as shown in FIG. 4A, while an acute angle may be formed between the riser 122 and the tread 121 as shown in FIG. 4B. The extremity area 120 can be trimmed or profiled by any conventional etching processes like plasma dry etching, chemical wet etching, and mechanical grinding. Preferably, the angle between the riser 122 and the tread 121 can be precisely formed by plasma dry etching.

Figure 5:
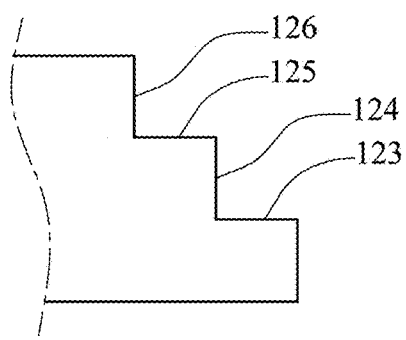
FIG. 5 is a cross-sectional view of the step-profiled peripheral extremity according to the embodiment.

In other embodiments, the extremity area 120 may be trimmed to have a profile of two steps as shown in FIG. 5. The stepped profile may include a first tread 123, a first riser 124, a second tread 125 and a second riser 126, and it functions to diminish surface defects due to lattice and thermal expansion mismatch between the epitaxial layer and the substrate wafer. The first tread 123 may be vertical or oblique to the first riser 124, and the second tread 125 may be vertical or oblique to the second riser 126.

Figure 6:
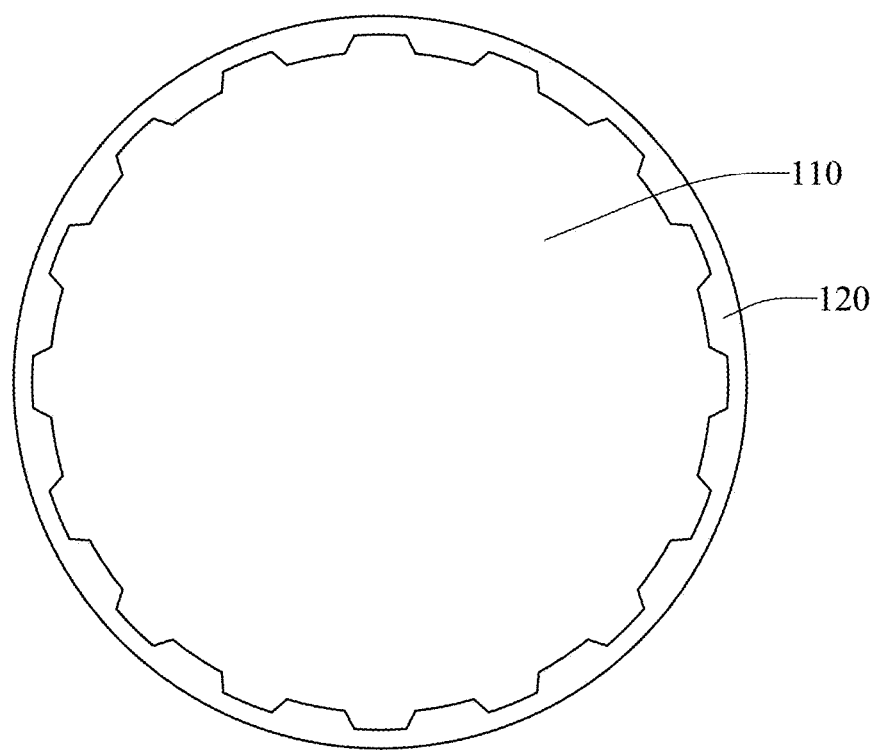
FIG. 6 is a plan view of a Si wafer according to another embodiment.

The central area 110 of the Si wafer 100 may have a circle outline as shown in FIG. 1A; that is, the interface is circle between the central area 110 and the extremity area 120. In other embodiments, the central area 110 may have an outline shape of a polygon or a cogwheel as shown in FIG. 6, in which the cogwheel-shaped outline has many teeth or cogs.

Figure 7:
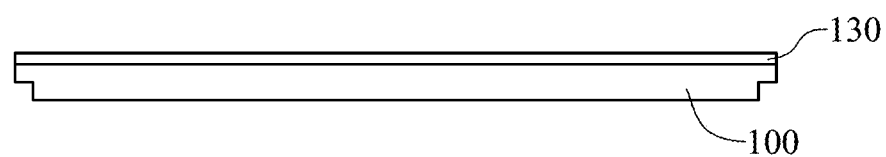
FIG. 7 is a cross-sectional view of an epitaxial wafer according to another embodiment.

The stepped profile of the extremity area 120 may formed on the upper surface (the front face) of the Si wafer 100, and the nitride epitaxial layer 130 is also grown on the upper surface, as shown in FIGS. 1 and 2. In another embodiment, the stepped profile of the extremity area 120 may formed on the lower surface (the back face) of the Si wafer 100, while the nitride epitaxial layer 130 is grown on the upper surface, as shown in FIG. 7.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. An epitaxial wafer comprising:
a silicon wafer having a central area and an extremity area enclosing the central area, the extremity area having a stepped profile; and
an nitride epitaxial layer formed on the silicon wafer;
wherein the stepped profile has a width between 10 and 1500 µm and a height between 1 and 500 µm;
wherein the silicon wafer has a first surface and a second surface opposite to the first surface, the central area and the extremity area located on the second surface, the nitride epitaxial layer formed on the first surface, and the extremity area is sandwiched between the central area and the nitride epitaxial layer.

2. The epitaxial wafer of claim 1, wherein the silicon wafer has a diameter of at least 6 inches.

3. The epitaxial wafer of claim 1, wherein the central area has an outline shape of a circle, a polygon or a cogwheel.

4. The epitaxial wafer of claim 1, wherein the stepped profile comprises a step with a tread and a riser vertical to the tread.

5. The epitaxial wafer of claim 1, wherein the stepped profile comprises a step with a tread and a slope not vertical to the tread.

6. An epitaxial wafer comprising:
a silicon wafer having a central area and an extremity area enclosing the central area, the extremity area having a stepped profile;
an nitride epitaxial layer formed on the silicon wafer;
wherein, the stepped profile has a width between 10 and 1500 µm and a height between 1 and 500 µm; and
wherein the stepped profile comprises two steps, each of the steps having a tread and a riser vertical to the tread.

7. An epitaxial wafer comprising:
a silicon wafer having a central area and an extremity area enclosing the central area, the extremity area having a stepped profile;
an nitride epitaxial layer formed on the silicon wafer;
wherein, the stepped profile has a width between 10 and 1500 µm and a height between 1 and 500 µm; and wherein the stepped profile comprises two steps, each of the steps having a tread and a riser not vertical to the tread.

* * * * *